United States Patent [19]
Horng

[11] Patent Number: 5,828,550
[45] Date of Patent: Oct. 27, 1998

[54] HEAT DISSIPATING FAN/INTEGRATED CIRCUIT ASSEMBLIES

[75] Inventor: Alex Horng, Kaohsiung, Taiwan

[73] Assignee: Motor-One Electronics, Inc., Taipei, Taiwan

[21] Appl. No.: 805,905

[22] Filed: Mar. 4, 1997

[51] Int. Cl.⁶ .................................................. H05K 7/20
[52] U.S. Cl. .................... 361/697; 165/122; 165/185; 257/719
[58] Field of Search .................... 165/80.2, 80.3, 165/122, 185; 174/163; 257/706–707, 712–713, 718–719, 722; 361/694–697, 704, 707, 710; 415/177

[56] References Cited

U.S. PATENT DOCUMENTS

| | | |
|---|---|---|
| 5,287,249 | 2/1994 | Chen . |
| 5,299,632 | 4/1994 | Lee . |
| 5,309,983 | 5/1994 | Bailey . |
| 5,335,722 | 8/1994 | Wu . |
| 5,368,094 | 11/1994 | Hung . |
| 5,409,352 | 4/1995 | Lin . |
| 5,421,402 | 6/1995 | Lin . |
| 5,495,392 | 2/1996 | Shen . |
| 5,664,624 | 9/1997 | Tsai et al. ............................ 361/697 |
| 5,678,627 | 10/1997 | Lee ...................................... 361/697 |
| 5,708,564 | 1/1998 | Lin ....................................... 361/697 |

FOREIGN PATENT DOCUMENTS

| | | |
|---|---|---|
| 2132324 | 10/1997 | United Kingdom . |
| 2313712 | 12/1997 | United Kingdom . |

OTHER PUBLICATIONS

Taiwan Office Action dated Jan. 3, 1998 for Taiwan Application No. 86202949 referencing Taiwan Patent No. 322,966 dated Dec. 11, 1997.

*Primary Examiner*—Gregory D. Thompson
*Attorney, Agent, or Firm*—Bacon & Thomas

[57] ABSTRACT

A heat dissipating fan/integrated circuit assembly includes a connector mounted on a printed circuit board and having two protrusions respectively projecting outwardly from two opposite sides thereof, an integrated circuit securely mounted to an upper side of the connector thereof, a fin mounted to an upper side of the integrated circuit, a fan device mounted on top of the fin and including two slots defined therein, and two engaging members respectively extending through the associated slots. Each engaging member includes an engaging hole defined in a lower end thereof for releasably engaging with the associated protrusion of the connector. An elastic member is mounted between each engaging member and the fan device to bias the associated engaging member away from the fan device, thereby providing a secure engagement between each protrusion and the associated engaging hole.

2 Claims, 5 Drawing Sheets

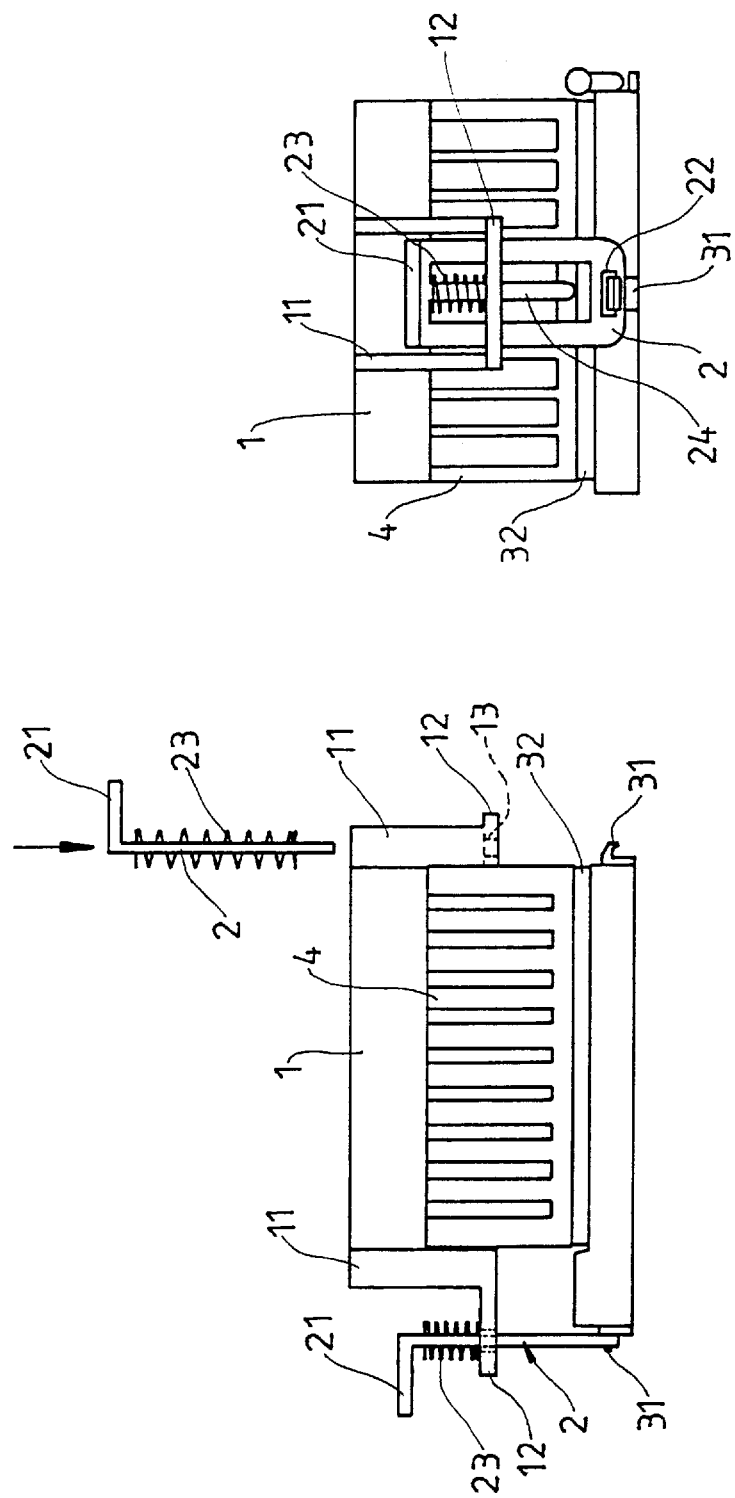

HEAT DISSIPATING FAN/INTEGRATED CIRCUIT ASSEMBLIES

BACKGROUND OF THE INVENTION

1. Field of the Invention

The present invention relates to improved assemblies for engagement between an integrated circuit and a heat dissipating fan.

2. Description of the Related Art

A wide varieties of devices have heretofore been provided to assist in heat dissipation of integrated circuits. Examples of such heat dissipation devices are U.S. Pat. No. 5,287,249 to Chen, U.S. Pat. No. 5,299,632 to Lee, U.S. Pat. No. 5,309,983 to Bailey, U.S. Pat. No. 5,335,722 to Wu, U.S. Pat. No. 5,368,094 to Hung, U.S. Pat. No. 5,409,352 to Lin, U.S. Pat. No. 5,421,402 to Lin, and U.S. Pat. No. 5,495,392 to Shen. A common drawback of the heat dissipation devices of the above U.S. patents is that the heat dissipating means and the integrated circuit are assembled by two stages, which is inconvenient to manufacture and assembly. In addition, the heat dissipating fins or heat sinks must be manufactured to particular shapes according to the need of assembly, which further causes inconvenience and incurs extra cost to manufacture. The present invention is intended to provide improved heat dissipation fan/integrated circuit assemblies which mitigate and/or obviate the above problems.

SUMMARY OF THE INVENTION

A heat dissipating fan/integrated circuit assembly in accordance with the present invention comprises a connector which is mounted on a printed circuit board and which includes an integrated circuit securely mounted to an upper side thereof. The connector further comprises two protrusions respectively projecting outwardly from two opposite sides thereof. A fin is mounted to an upper side of the integrated circuit. A fan device is mounted on top of the fin and includes two slots defined therein. Two engaging members respectively extend through the associated slots, each engaging member including an engaging hole defined in a lower end thereof for releasably engaging with the associated protrusion of the connector. An elastic member is mounted between each engaging member and the fan device to bias the associated engaging member away from the fan device, thereby providing a secure engagement between each said protrusion and the associated engaging hole.

The fan device may include two extension members which respectively extend downwardly from two sides of the fan device, wherein each extension member includes a bottom plate in which the slot is defined. Preferably, each engaging member includes a stem around which the elastic member is mounted.

Other objects, advantages, and novel features of the invention will become more apparent from the following detailed description when taken in conjunction with the accompanying drawings.

BRIEF DESCRIPTION OF THE DRAWINGS

FIG. 2 is a front elevational view illustrating assembly of the heat dissipating fan/integrated circuit assembly in FIG. 1;

FIG. 3 is a side elevational view of the heat dissipating fan/integrated circuit assembly in FIG. 1;

DESCRIPTION OF THE PREFERRED EMBODIMENT

Figure 1:
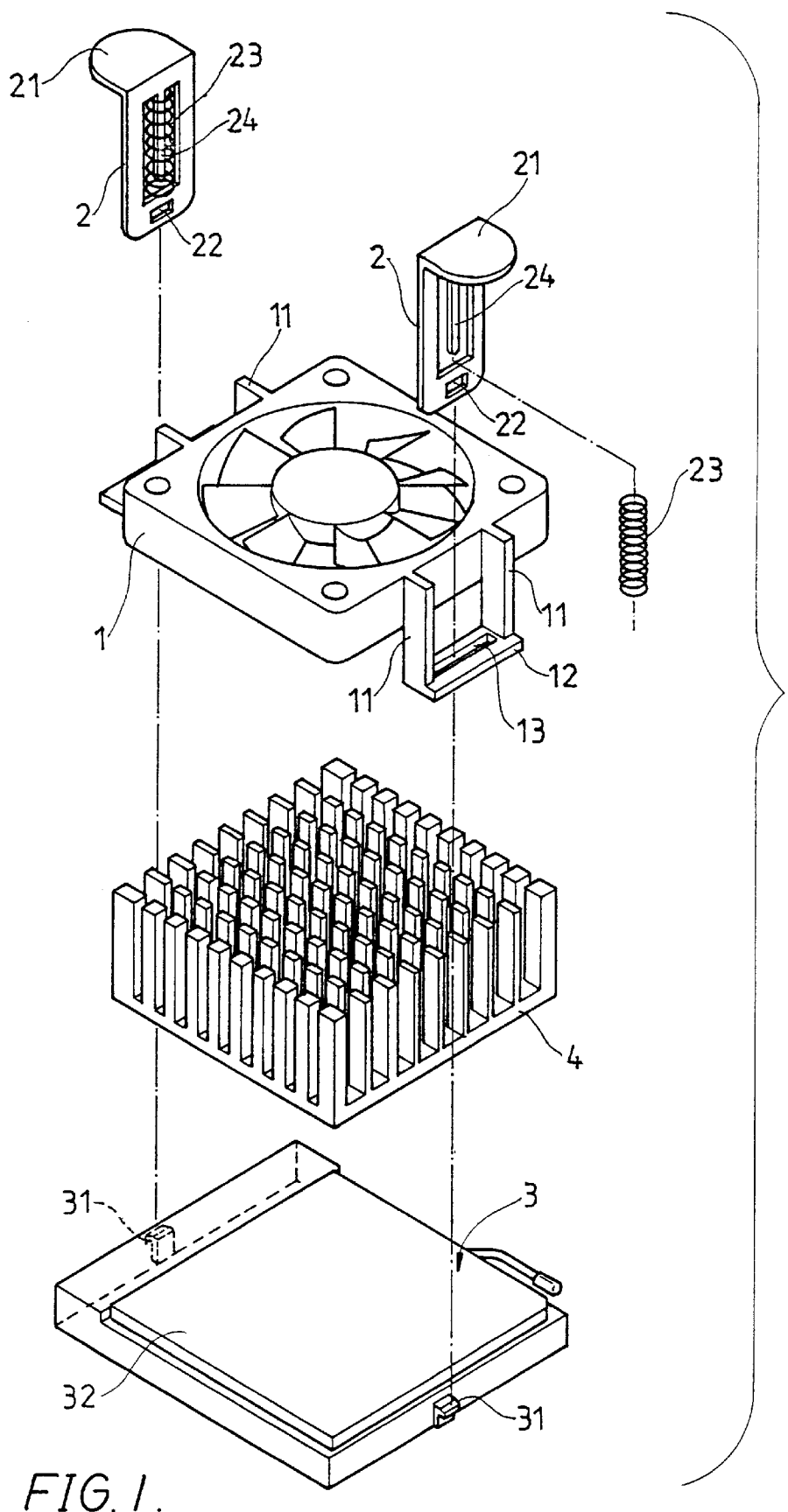
FIG. 1 is an exploded perspective view of a first embodiment of a heat dissipating fan/integrated circuit assembly in accordance with the present invention.

Referring to FIGS. 1 to 7 of the drawings and initially to FIGS. 1 to 3, a heat dissipating fan/integrated circuit assembly in accordance with the present invention generally comprises a connector 3 mounted on a printed circuit board (not shown), a fin 4, a fan device 1, and two engaging members 2. An integrated circuit 32 is securely mounted to an upper side of the connector 3. Connections between the integrated circuit 32, the connector 3, and the printed circuit board are conventional and therefore not further described. The connector further includes two protrusions 31 respectively projecting outwardly from two opposite sides thereof.

The fin 4 is mounted to an upper side of the integrated circuit 32, and the fan device 1 is mounted on top of the fin 4 and includes two extension members which respectively extend downwardly from two sides of the fan device 1. In this embodiment, each extension member includes two vertical arms 11 and a bottom plate 12 interconnected between the vertical arms 11, each bottom plate 12 having a slot 13 defined therein.

Each engaging member 2 extends through the associated slot 13 and includes an engaging hole 22 defined in a lower end thereof for releasably engaging with the associated protrusion 31 of the connector 3. Preferably, each engaging member 2 has an enlarged upper end 21 for easy manipulation by fingers of the user. In addition, each engaging member 2 includes a stem 24 around which an elastic member 23 is mounted. In this embodiment, the elastic member 23 is a spring.

As shown in FIGS. 2 and 3, the user may simply extend the engaging members 2 through the associated slots 13 until the engaging holes 22 receive the associated protrusions 31 (preferably in the form of hooks). Still referring to FIGS. 2 and 3, each elastic member 23 is mounted between the associated engaging member 2 and the fan device 1 to bias the associated engaging member 2 away from the fan device 1, thereby providing a secure engagement between each protrusion 31 and the associated engaging hole 22.

Figure 4:
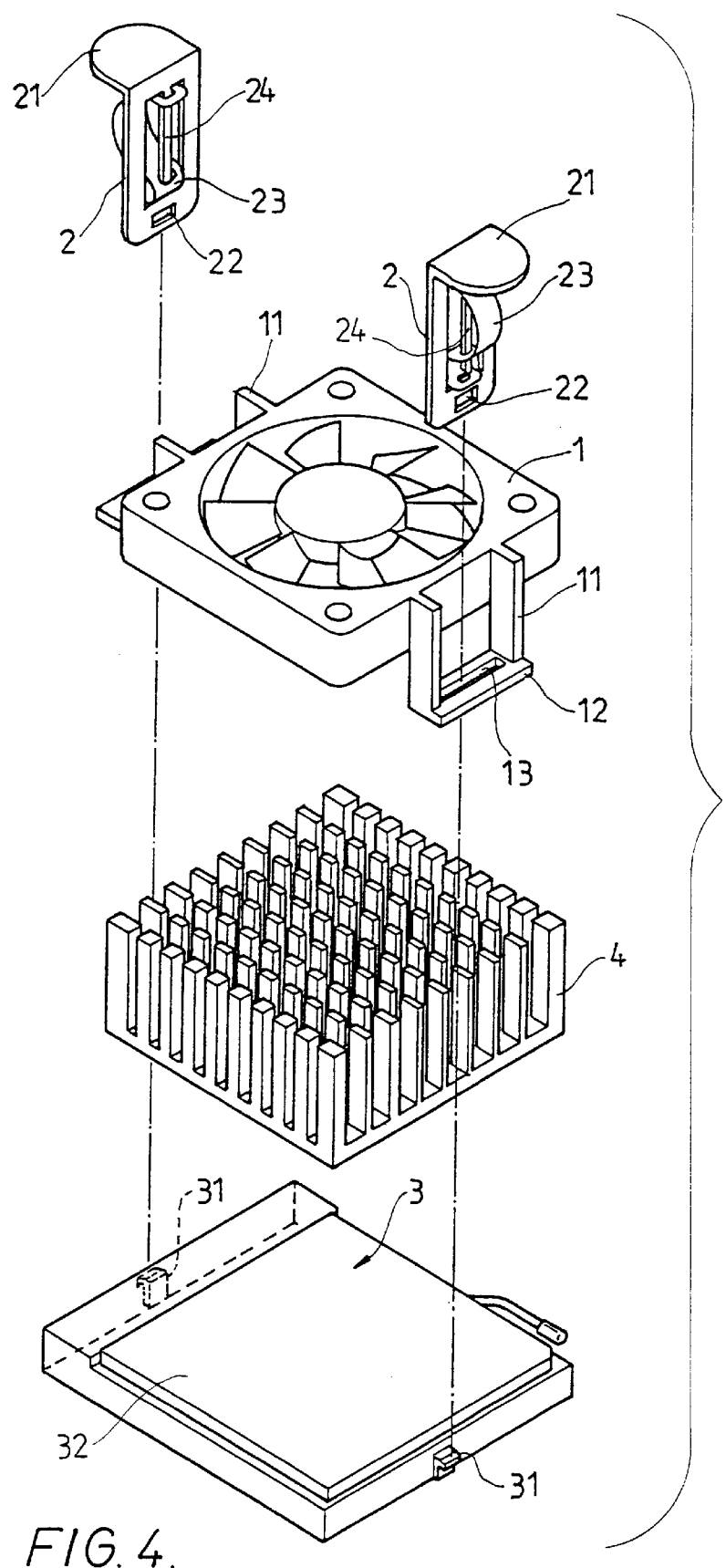
FIG. 4 is an exploded perspective view of a second embodiment of a heat dissipating fan/integrated circuit assembly in accordance with the present invention.

FIG. 4 illustrates a modified embodiment of the invention in which the elastic member 23 is in the form of an elastic arcuate plate spring.

Figure 5:
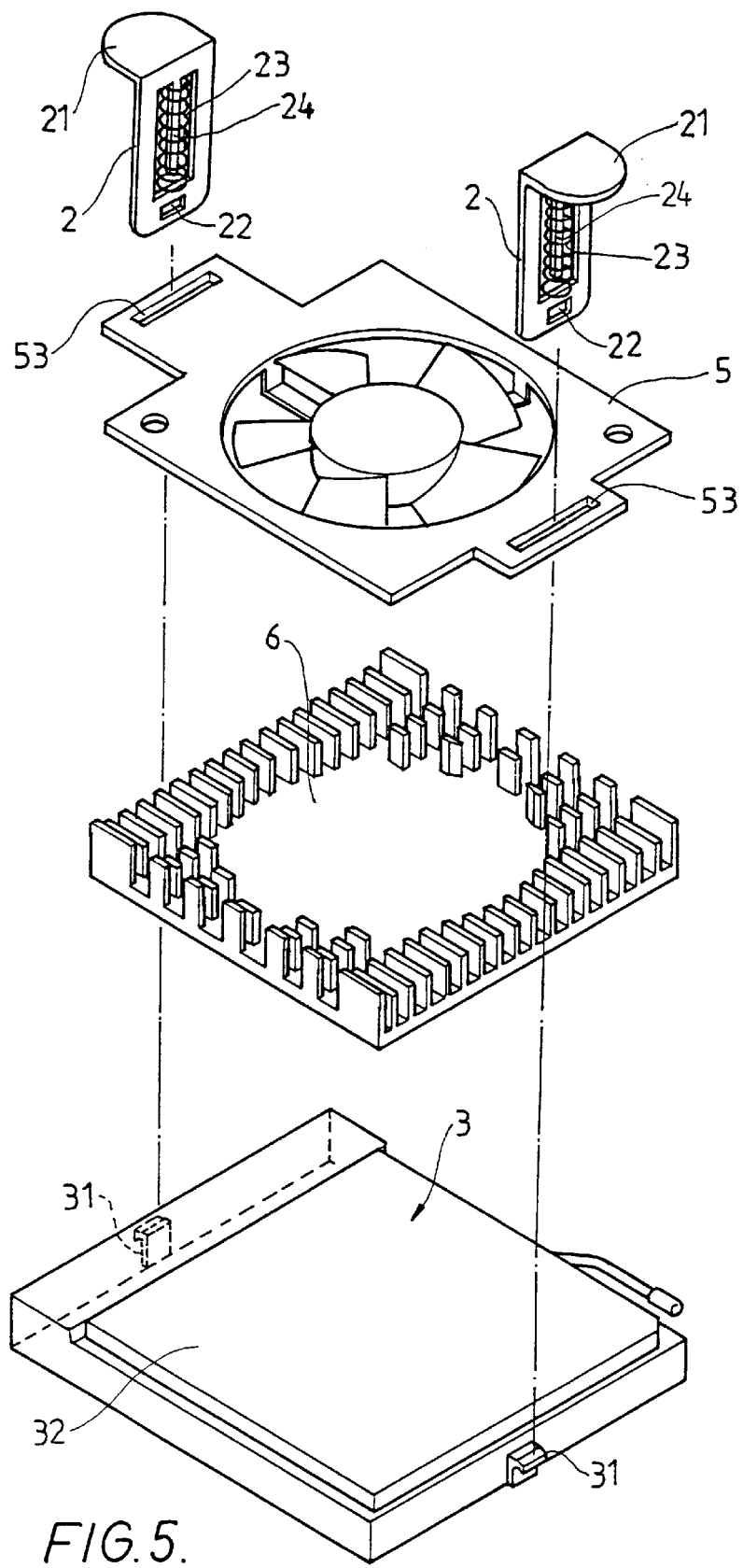
FIG. 5 is an exploded perspective view of a third embodiment of a heat dissipating fan/integrated circuit assembly in accordance with the present invention.
Figure 7:
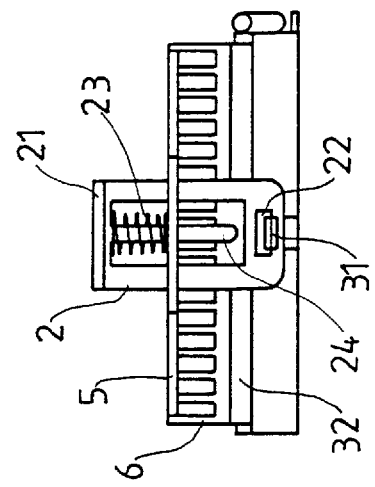
FIG. 7 is a side elevational view of the heat dissipating fan/integrated circuit assembly in FIG. 5.
Figure 6:
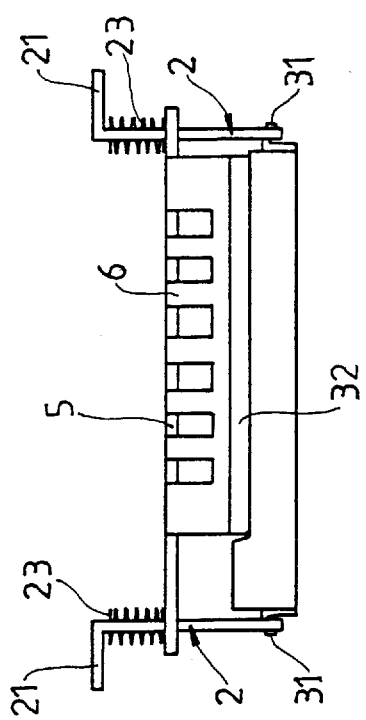
FIG. 6 is a front elevational view illustrating assembly of the heat dissipating fan/integrated circuit assembly in FIG. 5.

FIGS. 5 to 7 illustrates a further embodiment of the invention for use with a fin (now designated by reference numeral "6") having a relatively small thickness. In this embodiment, the fan device, now designated by reference numeral "5", is flat and includes two slots 53 respectively defined in two sides thereof through which the associated engaging members 2 extend. Structures of other elements and the engagements therebetween are the same to those of the first embodiment and are therefore not described to avoid redundancy.

According to the above description, it is appreciated that the present invention can be used on fins, fan devices, and connectors of different shapes, and the processing, manufacture, and assembly thereof are simple.

Although the invention has been explained in relation to its preferred embodiment, it is to be understood that many other possible modifications and variations can be made without departing from the spirit and scope of the invention as hereinafter claimed.

What is claimed is:

1. A heat dissipating fan/integrated circuit assembly, comprising:

a connector adapted to be mounted on a printed circuit board, the connector having an integrated circuit securely mounted to an upper side thereof, the integrated circuit having an upper side, the connector further comprising two protrusions respectively projecting outwardly from two opposite sides thereof, a fin mounted to the upper side of the integrated circuit;

a fan device mounted on top of the fin and including two slots defined therein;

two engaging members, each engaging member having a stem and each said engaging member extending through an associated slot, each said engaging member further including an engaging hole defined in a lower end of the respective engaging member for releasably engaging with an associated protrusion of the connector; and an elastic member being mounted by the stem of each said engaging member, said elastic member being mounted between each said engaging member and the fan device to bias the associated engaging member away from the fan device, thereby providing a secure engagement between each said protrusion and the associated engaging hole.

2. A heat dissipating fan/integrated circuit assembly according to claim 1, wherein:

the fan device includes two extension members which respectively extend downwardly from two sides of the fan device, each said extension member includes a bottom plate in which the slot is defined.

* * * * *